US009257167B2

(12) United States Patent
Fujita

(10) Patent No.: US 9,257,167 B2
(45) Date of Patent: Feb. 9, 2016

(54) RESISTANCE CHANGE MEMORY

(71) Applicant: Katsuyuki Fujita, Seoul (KR)

(72) Inventor: Katsuyuki Fujita, Seoul (KR)

(*) Notice: Subject to any disclaimer, the term of this patent is extended or adjusted under 35 U.S.C. 154(b) by 0 days.

(21) Appl. No.: 14/482,904

(22) Filed: Sep. 10, 2014

(65) Prior Publication Data

US 2015/0262639 A1   Sep. 17, 2015

Related U.S. Application Data

(60) Provisional application No. 61/952,696, filed on Mar. 13, 2014.

(51) Int. Cl.
*G11C 11/16* (2006.01)
*G11C 11/14* (2006.01)
*G11C 7/04* (2006.01)
*G11C 11/02* (2006.01)
*G11C 29/44* (2006.01)
*G11C 11/56* (2006.01)
*G11C 7/08* (2006.01)
*G11C 16/26* (2006.01)
*G11C 13/00* (2006.01)
*G11C 29/04* (2006.01)

(52) U.S. Cl.
CPC ........ *G11C 11/1675* (2013.01); *G11C 11/1673* (2013.01); *G11C 29/44* (2013.01); *G11C 7/04* (2013.01); *G11C 7/08* (2013.01); *G11C 11/16* (2013.01); *G11C 11/5607* (2013.01); *G11C 13/004* (2013.01); *G11C 16/26* (2013.01); *G11C 2029/0411* (2013.01)

(58) Field of Classification Search
CPC ...... G11C 11/16; G11C 11/5607; G11C 7/08; G11C 2029/0411; G11C 7/04; G11C 16/26; G11C 13/004
USPC .............................. 36/148, 158, 163; 365/211
See application file for complete search history.

(56) References Cited

U.S. PATENT DOCUMENTS

| 2004/0252551 | A1 | 12/2004 | Iwata et al. | |
|---|---|---|---|---|
| 2005/0036362 | A1 | 2/2005 | Iwata et al. | |
| 2007/0280023 | A1* | 12/2007 | Happ et al. | 365/222 |
| 2008/0084738 | A1* | 4/2008 | Philipp et al. | 365/185.03 |
| 2008/0117663 | A1* | 5/2008 | Philipp et al. | 365/148 |
| 2008/0219046 | A1* | 9/2008 | Chen et al. | 365/163 |
| 2009/0010040 | A1* | 1/2009 | Takase | 365/148 |
| 2013/0003438 | A1* | 1/2013 | Merkel et al. | 365/148 |
| 2014/0098600 | A1* | 4/2014 | Kim et al. | 365/158 |

FOREIGN PATENT DOCUMENTS

| JP | 2010092521 A | 4/2010 |
|---|---|---|
| JP | 2011170961 A | 9/2011 |

* cited by examiner

*Primary Examiner* — Ly D Pham
(74) *Attorney, Agent, or Firm* — Holtz, Holtz & Volek PC

(57) ABSTRACT

According to one embodiment, a resistance change memory comprises a memory cell array, a write and read circuit, a temperature sensor, and a memory controller. The memory cell array comprises memory cells including magnetic tunnel junction (MTJ) elements. The write and read circuit performs a write operation and a read operation for the memory cells. The temperature sensor outputs temperature information corresponding to a temperature of the memory cell array. The memory controller controls the write operation and the read operation by the write and read circuit in accordance with the temperature information.

17 Claims, 8 Drawing Sheets

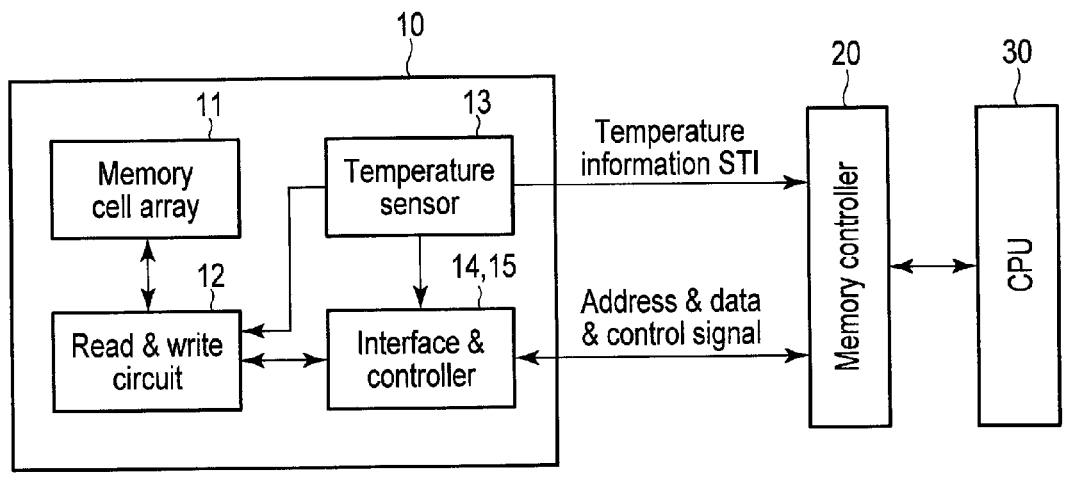
F I G. 1

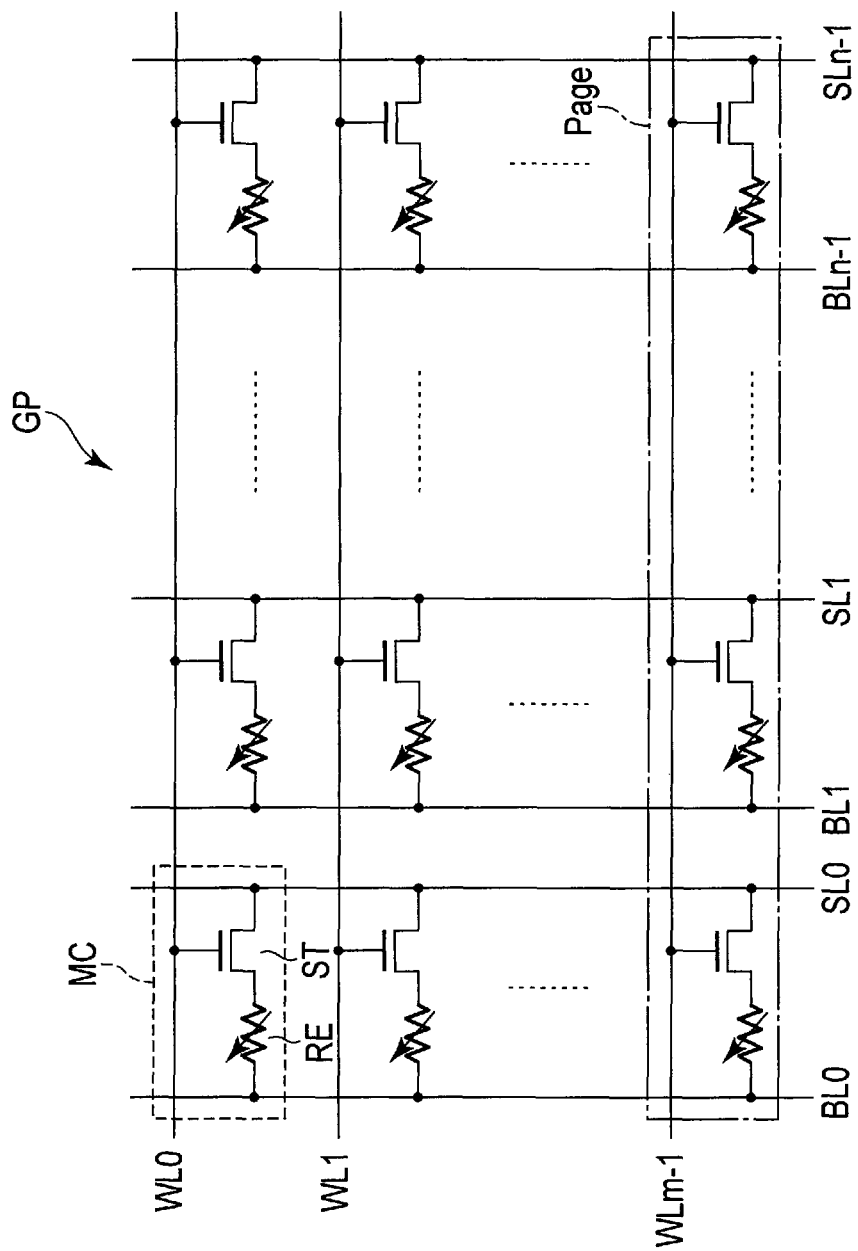
F I G. 4

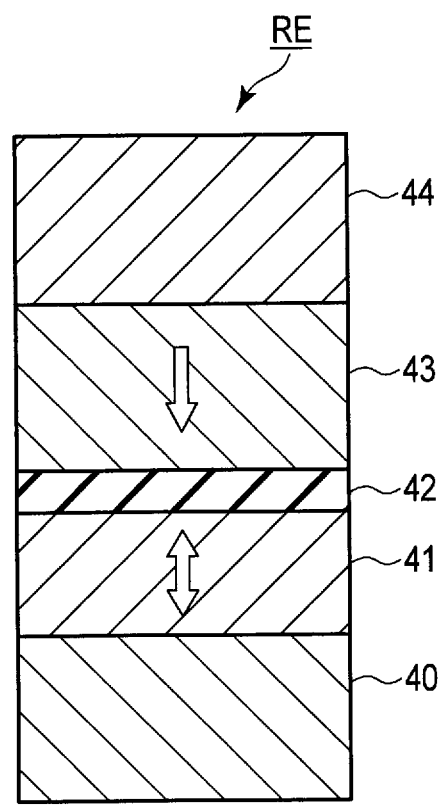
F I G. 5

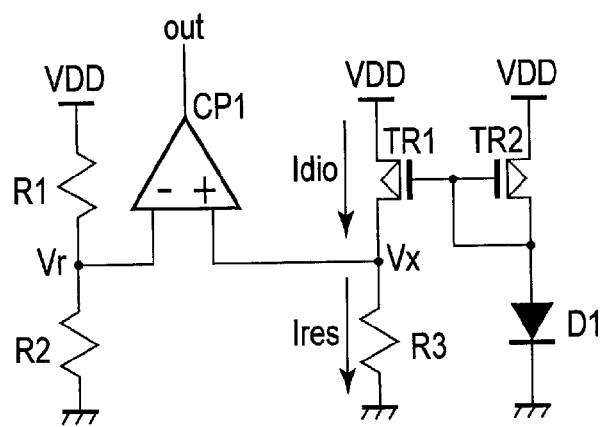
F I G. 6
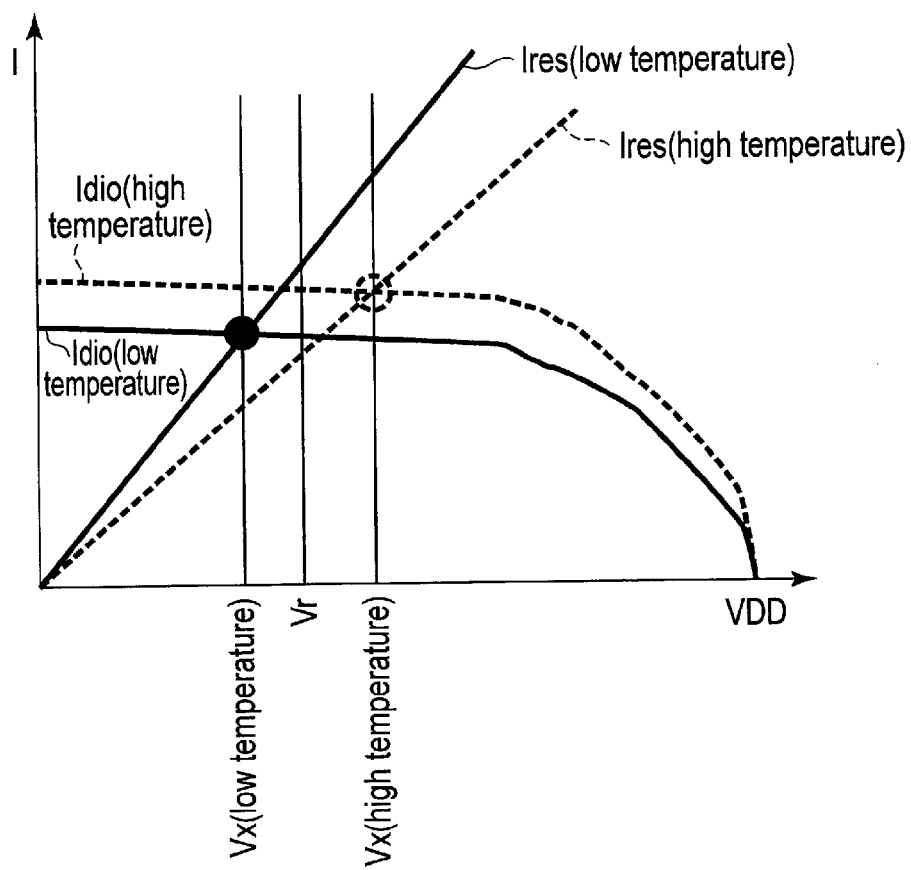
F I G. 7

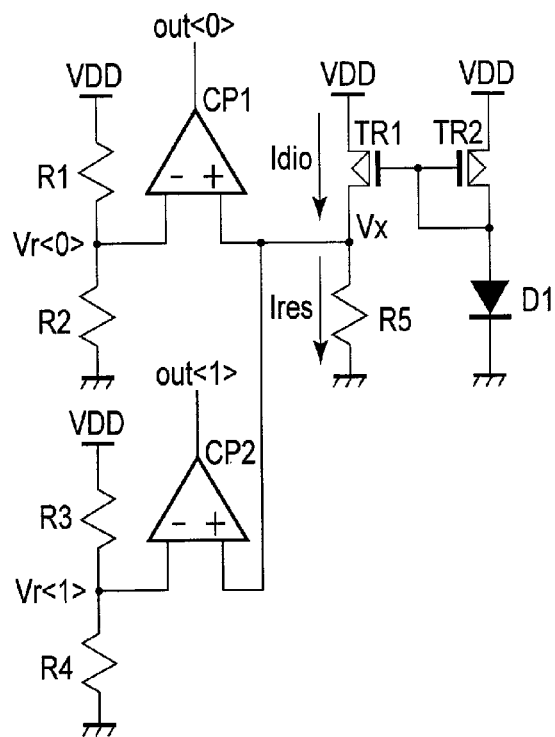
F I G. 8
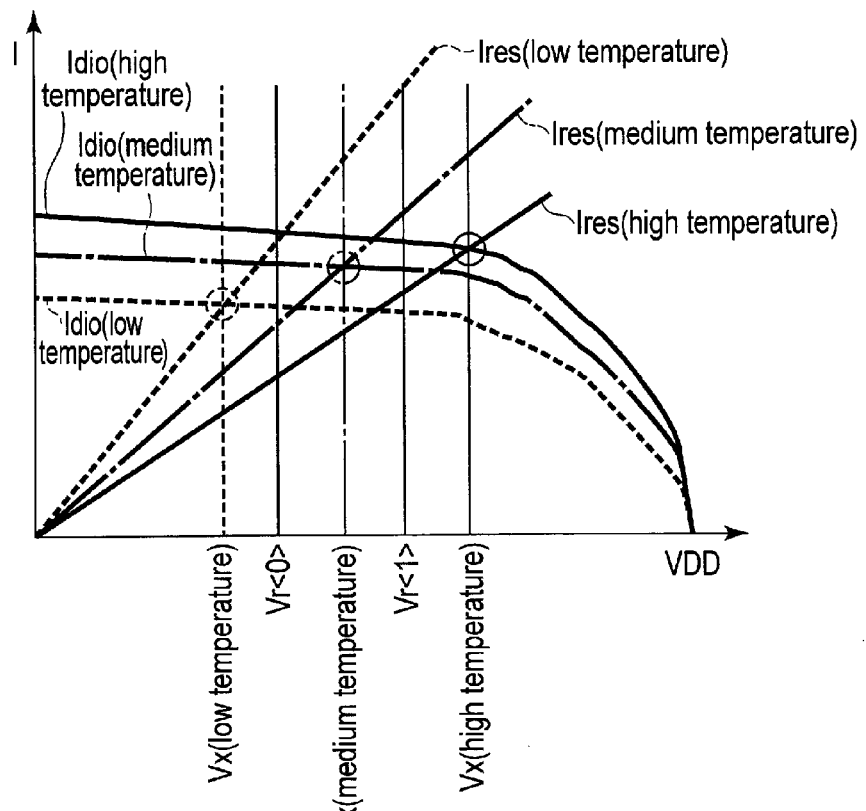
F I G. 9

RESISTANCE CHANGE MEMORY

CROSS-REFERENCE TO RELATED APPLICATIONS

This application claims the benefit of U.S. Provisional Application No. 61/952,696, filed Mar. 13, 2014, the entire contents of which are incorporated herein by reference.

FIELD

Embodiments described herein relate generally to a resistance change memory to store data by using the change of the resistance value of a memory element.

BACKGROUND

Recently, attention has been focused on semiconductor memories that use, as a memory device, a nonvolatile memory such as a resistance change memory (e.g., a magnetoresistive random access memory: MRAM, a phase change random access memory: PRAM, or a resistive random access memory: ReRAM).

In the resistance change memory, the change of its resistance value caused by the application of a current (or voltage) is used to determine whether data is "1" or "0".

BRIEF DESCRIPTION OF THE DRAWING

FIG. 1 is a diagram showing the configuration of an MRAM according to an embodiment;

FIG. 4 is a circuit diagram of one group GP included in the memory cell array according to the embodiment;

FIG. 5 is a sectional view of an MTJ element according to the embodiment;

FIG. 6 is a circuit diagram of an example of a temperature sensor according to the embodiment;

FIG. 7 is a graph showing the current characteristics of the example of the temperature sensor according to the embodiment;

FIG. 8 is a circuit diagram of another example of a temperature sensor according to the embodiment;

FIG. 9 is a graph showing the current characteristics of the other example of the temperature sensor according to the embodiment;

DETAILED DESCRIPTION

Figure 2:
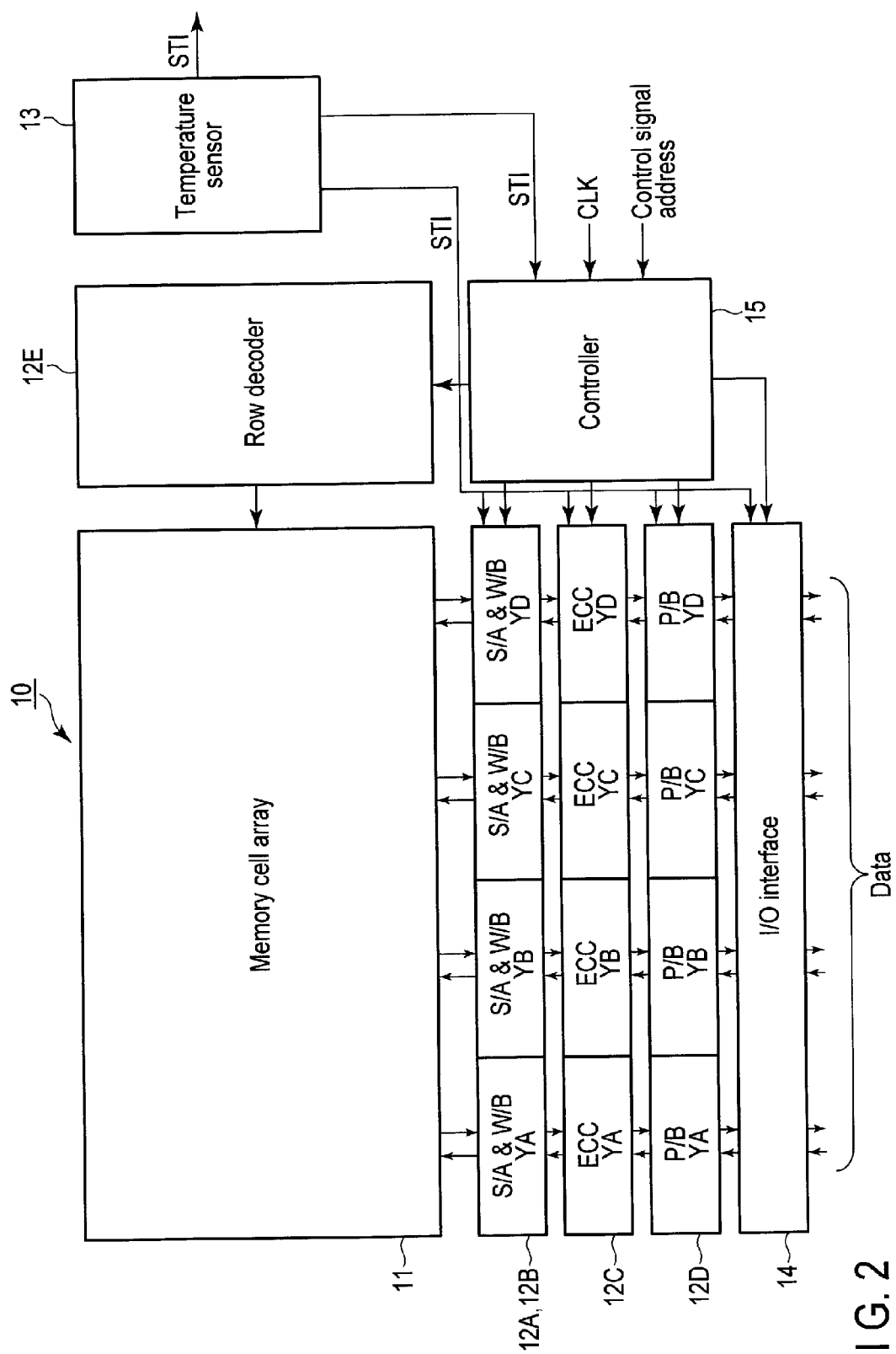
FIG. 2 is a diagram showing the detailed configuration of the MRAM according to the embodiment.

Hereinafter, a resistance change memory according to an embodiment will be described with reference to the drawings. In the following description, the same reference signs are provided to components having the same functions and configurations, and repeated explanations are given only when necessary. Embodiments shown below illustrate devices and methods which embody the technical concepts of the embodiments, and the materials, shapes, structures, and locations of the components are not specified as below.

In general, according to one embodiment, a resistance change memory comprises a memory cell array, a write and read circuit, a temperature sensor, and a memory controller. The memory cell array comprises memory cells including magnetic tunnel junction (MTJ) elements. The write and read circuit performs a write operation and a read operation for the memory cells. The temperature sensor outputs temperature information corresponding to a temperature of the memory cell array. The memory controller controls the write operation and the read operation by the write and read circuit in accordance with the temperature information.

An MRAM is described as an example of the resistance change memory in the embodiment below.

[1] Configuration of MRAM

FIG. 1 is a diagram showing the configuration of the MRAM according to the embodiment.

According to the present embodiment, an MRAM 10 and a memory controller 20 are provided. The MRAM 10 includes a memory cell array 11, a read/write circuit 12, a temperature sensor 13, an interface 14, and a controller 15. The MRAM 10 can store data in memory cells disposed in the memory cell array 11. The memory controller 20 controls the operation of the MRAM 10. A CPU 30 may be further connected to the memory controller 20 as an external system. The CPU 30 sends signals to the memory controller 20 and receives signals from the memory controller 20.

The detailed configuration of the MRAM according to the embodiment is shown in FIG. 2.

The memory cell array 11 includes the memory cells. Here, the memory cells have magnetoresistive effect elements, for example, magnetic tunnel junction (MTJ) elements as resistance change elements. The configuration of the memory cells will be described in detail later.

The read/write circuit 12 comprises a sense amplifier (S/A) 12A, a write buffer (W/B) 12B, an error checking and correcting (ECC) circuit 12C, a page buffer (P/B) 12D, and a row decoder 12E.

[1-1] Configuration of Memory Cell Array

Figure 3:
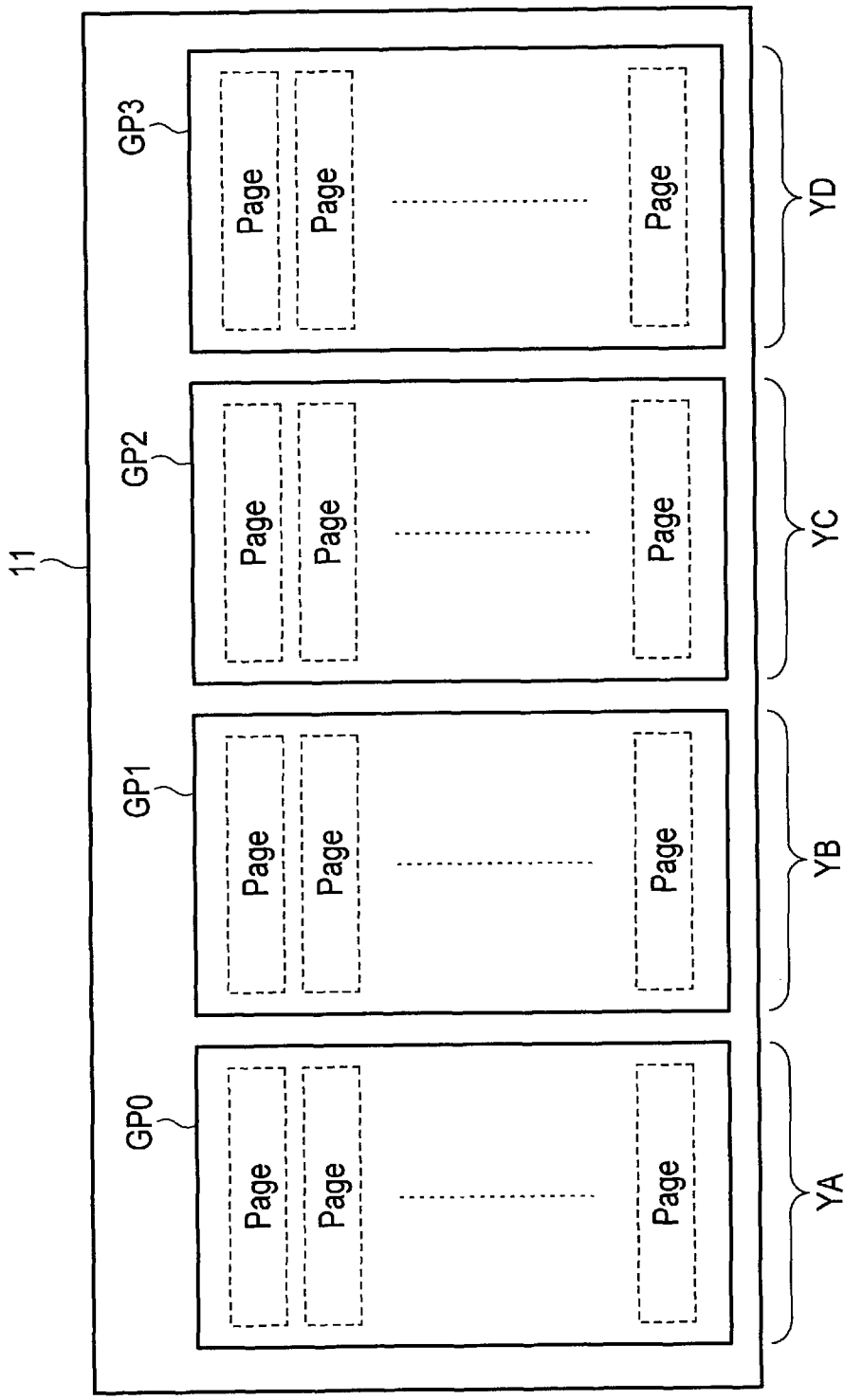
FIG. 3 is a block diagram of a memory cell array according to the embodiment.

FIG. 3 is a block diagram of the memory cell array 11. The memory cell array 11 comprises groups GP. In FIG. 3, four groups GP0 to GP3 are shown by way of example. Each group GP is a unit for independently performing a data write operation and a data read operation (interleave processing and parallel processing). While the interleave processing is performed by four columns YA, YB, YC, and YD corresponding to the four groups GP0 to GP3 in the following explanation by way of example, the number of groups GP (number of columns) can be designed to be any number. Each group GP comprises pages.

FIG. 4 is a circuit diagram of one group GP included in the memory cell array 11. The group GP is composed of memory cells MC arrayed in a matrix form. Word lines WL0 to WLm−1, bit lines BL0 to BLn−1, and source lines SL0 to SLn−1 are arranged in the group GP. A memory cell group for one row of groups GP, that is, for one page is connected to one word line WL. One column of groups GP is connected to a pair comprising one bit line BL and one source line SL. The common word lines WL0 to WLm−1 are connected to the groups GP0 to GP3. m and n are natural numbers equal to or more than 1.

The memory cell MC comprises, for example, a magnetic tunnel junction (MTJ) element RE and a select transistor ST. The select transistor ST comprises, for example, an re-channel MOS field effect transistor.

One end of the MTJ element RE is connected to the bit line BL, and the other end of the MTJ element RE is connected to the drain of the select transistor ST. The source of the select transistor ST is connected to the source line SL. Moreover, the gate of the select transistor ST is connected to the word line WL.

[1-2] Structure of MTJ Element

Now, one example of the structure of the MTJ element RE is described. FIG. 5 is a sectional view of the MTJ element RE. The MTJ element RE comprises a bottom electrode 40, a storage layer (also referred to as a free layer) 41, a nonmagnetic layer (tunnel barrier layer) 42, a reference layer (also referred to as a fixed layer) 43, and a top electrode 44 that are stacked in the order above. The storage layer 41 and the reference layer 43 may be stacked in reverse order.

The storage layer 41 and the reference layer 43 are made of a ferromagnetic material. An insulating material such as MgO is used as the tunnel barrier layer 42.

The storage layer 41 and the reference layer 43 have perpendicular magnetic anisotropy, and their directions of easy magnetization are perpendicular directions. The magnetization directions of the storage layer 41 and the reference layer 43 may be in-plane directions.

The magnetization direction of the storage layer 41 is variable (inverted). The magnetization direction of the reference layer 43 is invariable (fixed). The reference layer 43 is set to have sufficiently higher perpendicular magnetic anisotropic energy than the storage layer 41. The magnetic anisotropy can be set by adjusting material constitution and thickness. Thus, a magnetization inversion current for the storage layer 41 is lower, and a magnetization inversion current for the reference layer 43 is higher than that for the storage layer 41. As a result, it is possible to obtain an MTJ element RE that comprises the storage layer 41 variable in magnetization direction and the reference layer 43 invariable in magnetization direction for a predetermined write current.

According to the present embodiment, a spin-transfer torque writing method is used so that a write current is directly passed through the MTJ element RE, and the magnetization state of the MTJ element RE is controlled by this write current. The MTJ element RE can take one of a low-resistance state and a high-resistance state depending on whether the magnetizations of the storage layer 41 and the reference layer 43 are parallel or antiparallel.

If a write current running from the storage layer 41 to the reference layer 43 is passed through the MTJ element RE, the magnetizations of the storage layer 41 and the reference layer 43 are parallel. In this parallel state, the resistance value of the MTJ element RE is lowest, and the MTJ element RE is set to the low-resistance state. The low-resistance state of the MTJ element RE is determined as, for example, data "0".

On the other hand, if a write current running from the reference layer 43 to the storage layer 41 is passed through the MTJ element RE, the magnetizations of the storage layer 41 and the reference layer 43 are antiparallel. In this antiparallel state, the resistance value of the MTJ element RE is highest, and the MTJ element RE is set to the high-resistance state. The high-resistance state of the MTJ element RE is determined as, for example, data "1".

Consequently, the MTJ element RE can be used as a storage element capable of storing one-bit data (binary data). Any resistance state of the MTJ element RE and any allocation of data can be set.

When data is read from the MTJ element RE, a read voltage is applied to the MTJ element RE, and the resistance value of the MTJ element RE is detected in accordance with a read current running through the MTJ element RE at the moment. This read voltage is set to a value that is sufficiently lower than a threshold at which the magnetization is inverted by spin injection.

[1-3] Configuration of Read/Write Circuit

In FIG. 2, the sense amplifier 12A, the write buffer 12B, the ECC circuit 12C, and the page buffer 12D are provided for each of the columns YA, YB, YC, and YD. In the following explanation, when the sense amplifier 12A, the write buffer 12B, the ECC circuit 12C, and the page buffer 12D are mentioned in this way, this means that the columns YA to YD have a common configuration. On the other hand, the reference signs YA to YD are given only when the columns YA to YD need to be distinguished from one another.

The row decoder 12E is connected to the word lines WL0 to WLm−1. The row decoder 12E selects one of the word lines WL in accordance with a row address.

The sense amplifier 12A is connected to the bit lines BL0 to BLn−1. The sense amplifier 12A of, for example, a current detecting type compares a cell current running through the selected memory cell via the bit line BL with a reference current, and thereby detects and amplifies the data in the selected memory cell. During reading, the source lines are clamped to a ground voltage VSS by the write buffer 12B. An output from the write buffer 12B to the bit line is set to a Hi-Z state (high impedance state) to avoid conflicting with the operation of the sense amplifier.

The write buffer 12B is connected to the bit lines BL0 to BLn−1 and the source lines SL0 to SLn−1. The write buffer 12B writes data into the selected memory cell via the bit line BL and the source line SL.

The ECC circuit 12C performs the ECC operation to detect an error in the read data and correct the error. That is, when data is written into the memory cell array 11, the ECC circuit 12C uses write data to generate an error correcting code, and adds this error correcting code to the write data. The error correcting code is written into a parity bit area in the memory cell array 11. When data is read from the memory cell array 11, the ECC circuit 12C uses the error correcting code read from the parity bit area to detect and correct an error. The error correcting code does not need to be read to the outside, and is therefore not read into the page buffer 12D. For such processing, the ECC circuit 12C comprises an ECC encoder and an ECC decoder.

The page buffer 12D holds the read data sent from the ECC circuit 12C. The page buffer 12D also holds the write data sent from the input/output interface circuit 14. The page buffer 12D comprises a read page buffer for holding read data, and a write page buffer for holding write data.

[1-4] Configurations of Interface and Controller

The input/output interface circuit 14 is connected to an external system, and inputs/outputs data to/from the external system. The input/output interface circuit 14 sends input data input from the external system to the page buffer 12D as write data. The input/output interface circuit 14 also outputs the read data received from the page buffer 12D to the external system as output data.

The controller 15 has overall control of the operations of the sense amplifier 12A, the write buffer 12B, the ECC circuit 12C, the page buffer 12D, the row decoder 12E, and the interface 14. The controller 15 receives an address (including a row address and a column address), and control signals such as a clock CLK and a command from the memory controller 20. The controller 15 supplies various control signals and various voltages to the sense amplifier 12A, the write buffer 12B, the ECC circuit 12C, the page buffer 12D, the row decoder 12E, and the interface 14, and thereby controls the operations of these circuits.

[1-5] Configuration of Temperature Sensor

The temperature sensor 13 is disposed in the vicinity of the memory cell array 11, and detects the temperature of the environment of the memory cell array 11, and then outputs temperature information STI corresponding to the detected temperature. The memory controller 20 receives the temperature information STI from the temperature sensor 13, and outputs a control signal for controlling the write operation and the read operation in the MRAM 10 to the controller 15 in accordance with the temperature information STI. The controller 15 receives the control signal from the memory controller 20, controls the read/write circuit 12 in accordance with the control signal, and performs the write operation and the read operation for the memory cell array 11. The write operation and the read operation will be described in detail later.

Now, one example of the configuration of the temperature sensor 13 is described. FIG. 6 is a circuit diagram of the temperature sensor 13 according to the embodiment. FIG. 7 is a graph showing the voltage-current characteristics of the temperature sensor 13.

As shown in FIG. 6, the temperature sensor 13 comprises a comparator CP1, resistances R1, R2, and R3, p-channel MOS field effect transistors TR1 and TR2, and a diode D1. A current running through the resistance R3 is Ires, and a current running through the diode D1 is Idio.

FIG. 7 shows the current characteristics of the current Ires and the current Idio in a low-temperature state and a high-temperature state. This graph shows the level relation between voltages Vx and Vr in the low-temperature state and the high-temperature state.

When the memory cell array 11 is in the low-temperature state, the voltage Vx is lower than the voltage Vr in FIG. 7. As a result, an output out becomes "low (L)". Therefore, when detecting that the memory cell array 11 is in the low-temperature state, the temperature sensor 13 outputs "L" as the temperature information STI.

When the memory cell array 11 is in the high-temperature state, the voltage Vx is higher than the voltage Vr in FIG. 7. As a result, the output out becomes "high (H)". Therefore, when detecting that the memory cell array 11 is in the high-temperature state, the temperature sensor 13 outputs "H" as the temperature information STI.

In response to "L" or "H" as the temperature information STI from the temperature sensor 13, the memory controller 20 controls the write operation and the read operation in accordance with "L" or "H".

Although the temperature sensor 13 detects the two temperature ranges including the low temperature and the high temperature in the example shown here, the temperature sensor 13 may detect three temperature ranges including the low temperature, the high temperature, and a medium temperature higher than the low temperature and lower than the high temperature. Moreover, the temperature sensor 13 may detect four or more temperature ranges. In this case, the circuits can be configured by adding comparators, resistances, and condensers.

One example of the configuration of the temperature sensor 13 which detects the three temperature ranges is shown below. FIG. 8 is a circuit diagram of the temperature sensor 13 which detects the three temperature ranges. FIG. 9 is a graph showing the voltage-current characteristics of the temperature sensor 13.

As shown in FIG. 8, the temperature sensor 13 comprises comparators CP1 and CP2, resistances R1, R2, R3, R4, and R5, p-channel MOS field effect transistors TR1 and TR2, and a diode D1. A current running through the resistance R5 is Ires, and a current running through the diode D1 is Idio.

FIG. 9 shows the current characteristics of the current Ires and the current Idio in temperature conditions: the low temperature, the medium temperature, and the high temperature. This graph shows the level, relation between voltages Vx, Vr<0>, and Vr<1> in each temperature condition. This level relation can be easily obtained by adjusting the resistance ratio of R1, R2, R3, and R4 so that Vr<0>=R2*VDD/(R1+R2)<Vr<1>=R3*VDD/(R3+R4).

When the memory cell array 11 is in a low-temperature state, the voltage Vx is lower than the voltages Vr<0> and Vr<1> in FIG. 8. As a result, both outputs out<1> and out<0> become "low (L)". Therefore, when detecting that the memory cell array 11 is in the low-temperature state, the temperature sensor 13 outputs "LL" as the temperature information STI.

When the memory cell array 11 is in the medium-temperature state, the voltage Vx is higher than the voltage Vr<0> and lower than Vr<1> in FIG. 8. As a result, the output out<1> becomes "low (L)", and the output out<0> becomes "high (H)". Therefore, when detecting that the memory cell array 11 is in the medium-temperature state, the temperature sensor 13 outputs "LH" as the temperature information STI.

When the memory cell array 11 is in the high-temperature state, the voltage Vx is higher than the voltages Vr<0> and Vr<1> in FIG. 8. As a result, both the outputs out<1> and out<0> become "high (H)". Therefore, when detecting that the memory cell array 11 is in the high-temperature state, the temperature sensor 13 outputs "HH" as the temperature information STI.

In response to "LL", "LH", or "HH" as the temperature information STI from the temperature sensor 13, the memory controller 20 controls the write operation and the read operation in accordance with "LL", "LH", or "HH".

Moreover, the temperature sensor 13 only uses standard components in a semiconductor circuit, and therefore has an advantage of being easily formable.

[2] Write Operation and Read Operation

Figure 10:
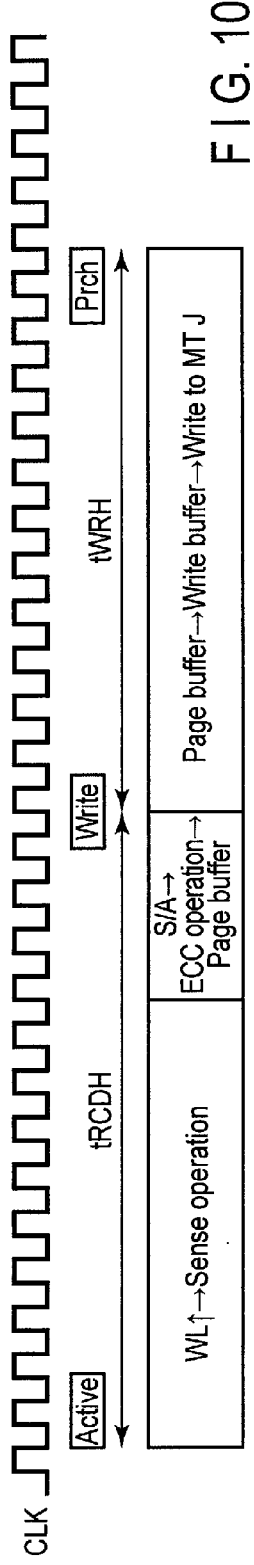
FIGS. 10 and 11 are diagrams showing a write operation and a read operation in the MRAM according to the embodiment.
Figure 11:
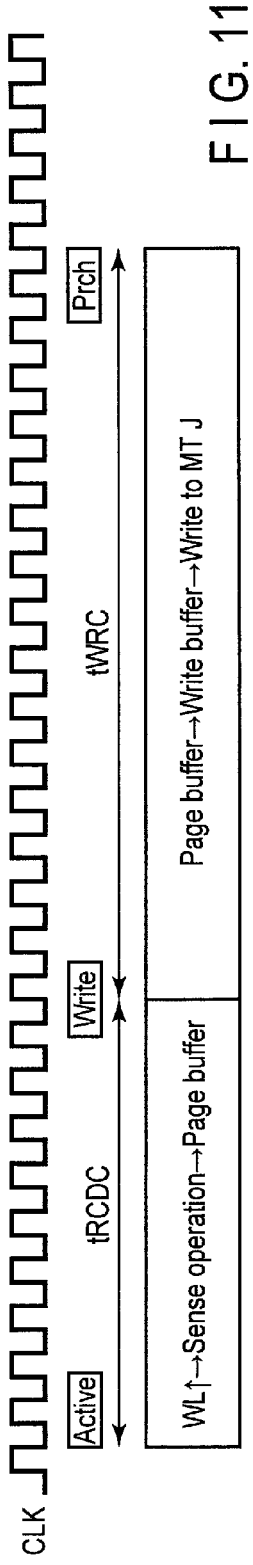
Figure 12:
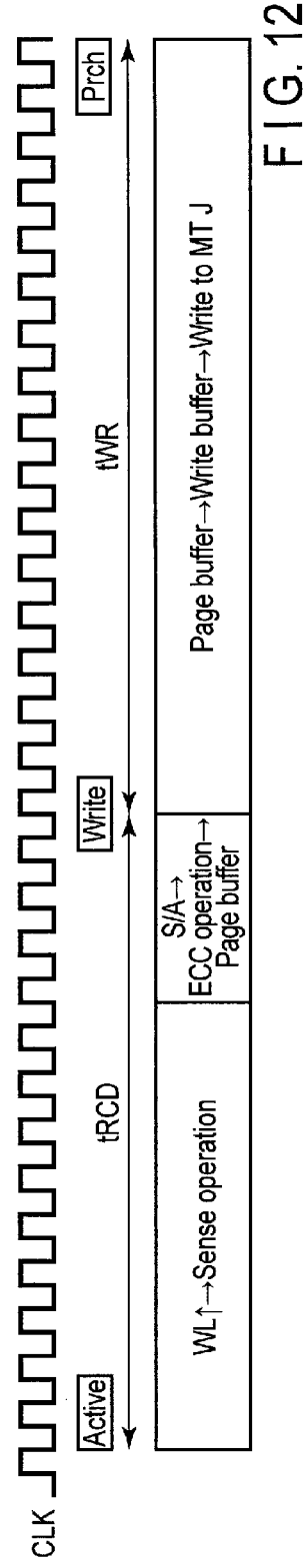
FIG. 12 is a diagram showing a write operation and a read operation in an MRAM according to a comparative example.

FIGS. 10 and 11 are diagrams showing the write operation and the read operation according to the embodiment. FIG. 12 is a diagram showing a write operation and a read operation according to a comparative example.

First, the write operation and the read operation according to the comparative example are described.

For example, in a memory cell including an MTJ element in an MRAM, when the memory cell is in a high-temperature state, the time required for writing is short, but read disturb easily occurs in reading. On the other hand, when the memory cell is in a low-temperature state, the incidence of the read disturb in reading is low, but the time required for writing is long.

Accordingly, in general, as shown in FIG. 12, a long write duration time tWR is set in writing on the assumption that the write duration time in the low-temperature state is long, whereas a read duration time tRCD is set to a time including the ECC operation in reading on the assumption that the read disturb easily occurs in the high-temperature state. Therefore, the write duration time tWR and the read duration time tRCD are unnecessarily long.

Thus, the write operation and the read operation according to the present embodiment are performed as below.

When receiving temperature information STI1 (first information) indicating a high temperature from the temperature sensor 13, the memory controller 20 sets the write operation and the read operation in the MRAM 10 to a later-described operation in the high-temperature state. When receiving temperature information STI2 (second information) indicating a low temperature lower than the high temperature, the memory controller 20 sets the write operation and the read operation in the MRAM 10 to a later-described operation in the low-temperature state. As described above, the temperatures detected by the temperature sensor 13 are the high temperature>the low temperature.

FIG. 10 shows the write operation and the read operation in the high-temperature state.

First, the write operation performed when the memory cell array 11 is in the high-temperature state is described. Write data input from the interface 14 is sequentially transferred to the page buffer 12D and the write buffer 12B, and written into the memory cell MC in the memory cell array 11. In this case, writing into the memory cell MC is easy in the high-temperature state. That is, the magnetization direction of the storage layer is inverted merely by passing a write current through the MTJ element RE included in the memory cell MC for a short time.

Thus, the memory controller 20 sets a time (write duration time tWRH) for passing the write current through the memory cell MC to be shorter than the write duration time tWR, as shown in FIG. 10. For example, the write duration time tWRH is set to 12 clocks.

On the other hand, the read operation performed when the memory cell array 11 is in the high-temperature state is as below. The word line WL is activated, and the memory cell MC is then selected, and a sense operation is then performed for the selected memory cell by the sense amplifier 12A. The ECC operation for the read data is performed by the ECC circuit 12C, and the read data is stored in the page buffer 12D. The data is further output to the outside from the page buffer 12D via the interface 14. In the high-temperature state, a data error easily occurs in reading, that is, the read disturb easily occurs, so that the ECC operation is performed as described above for the read data read by the sense operation.

Thus, the memory controller 20 controls to perform the sense operation, the ECC operation, and the transfer to the page buffer 12D as the read operation. Therefore, as shown in FIG. 10, the read operation requires a time (read duration time tRCDH) for the sense operation, the ECC operation, and the transfer to the page buffer 12D. For example, the read duration time tRCDH is set to 13 clocks. The ECC operation is an operation for detecting an error in read data and correcting the error.

FIG. 11 shows the write operation and the read operation in the low-temperature state.

First, the write operation performed when the memory cell array 11 is in the low-temperature state is described. Write data input from the interface 14 is sequentially transferred to the page buffer 12D and the write buffer 12B, and written into the memory cell MC in the memory cell array 11. In this case, writing into the memory cell MC is not easy in the low-temperature state. That is, the magnetization direction of the storage layer is not inverted unless a write current is passed through the MTJ element RE for a long time.

Thus, the memory controller 20 sets a time (write duration time tWRC) for passing the write current through the memory cell MC to be longer than the write duration time tWRH as shown in FIG. 11. For example, the write duration time tWRC is set to 16 clocks.

On the other hand, the read operation performed when the memory cell array 11 is in the low-temperature state is as below. The word line WL is activated, and the memory cell MC is then selected, and the sense operation is then performed for the selected memory cell by the sense amplifier 12A. The read data is stored in the page buffer 12D. The data is further output to the outside from the page buffer 12D via the interface 14. In the low-temperature state, the read disturb does not easily occur in reading, so that the ECC operation does not need to be performed for the read data read by the sense operation, in contrast with the high-temperature state.

Thus, the memory controller 20 controls to perform the sense operation and the transfer to the page buffer 12D as the read operation. Therefore, as shown in FIG. 11, the read operation only requires a time (read duration time tRCDC) for the sense operation and the transfer to the page buffer other than the ECC operation. The read duration time tRCDC is shorter than the read duration time tRCDH, and is set to, for example, 9 clocks.

A temperature sensor which not only detects the high temperature and the low temperature but also detects the medium temperature between the high temperature and the low temperature as shown in FIGS. 8 and 9 may be used. When receiving temperature information STI3 (third information) indicating the medium temperature from this temperature sensor, the memory controller 20 sets the write duration time for passing the write current through the memory cell MC to be longer than the write duration time tWRH and shorter than the write duration time tWRC. When receiving the third information STI3, the memory controller 20 may perform the sense operation, the ECC operation, and the transfer to the page buffer 12D as the read operation, or may perform the sense operation and the transfer to the page buffer 12D other than the ECC operation. Whether to perform the ECC operation is determined by the occurrence of the read disturb.

The temperature information STI output from the temperature sensor 13 is also input to the sense amplifier 12A, the write buffer 12B, the ECC circuit 12C, the page buffer 12D, the interface 14, and the controller 15. In response to the temperature information STI, the sense amplifier 12A, the write buffer 12B, the ECC circuit 12C, the page buffer 12D, the interface 14, and the controller 15 perform necessary operations in accordance with this temperature information STI. For example, in accordance with the temperature information STI, the ECC circuit 12C previously performs a switch operation which occurs depending on whether the ECC operation is performed. Depending on whether the ECC operation is performed, it is necessary to change the timing for transferring the read data to the sense amplifier 12A, the ECC circuit 12C, the page buffer 12D, and the interface 14. Thus, the temperature information STI is also transmitted to the controller 15 so that the controller 15 controls the timing for transferring the read data in accordance with the temperature information STI.

[3] Advantageous Effects

As described above, when the memory cell is in the high-temperature state, the time required for writing is short, but the read disturb easily occurs in reading. On the other hand, when the memory cell is in the low-temperature state, the incidence of the read disturb in reading is low, but the time required for writing is long.

Accordingly, in general, a long write duration time is set in writing on the assumption that the write duration time in the low-temperature state is long, whereas the read duration time is set to the time including the ECC operation in reading on the assumption that the read disturb easily occurs in the high-temperature state. Therefore, the times required for the write operation and the read operation are unnecessarily long.

Under these circumstances, according to the present embodiment, the temperature sensor which detects the temperature of the memory cell in the memory cell array is provided, and the memory controller controls the write operation and the read operation in accordance with the temperature information detected by the temperature sensor. In the high-temperature state, the time for passing the write current through the MTJ element in the memory cell is shortened to reduce the write duration time. On the other hand, in the low-temperature state, the ECC operation is eliminated from the read operation to reduce the read duration time. As a result, it is possible to reduce the times required for the read operation and the write operation in the MRAM.

Although the MRAM that uses the magnetoresistive effect element has been described as the resistance change memory by way of example in the above embodiment, the present embodiment is not limited thereto. The present embodiment is also applicable to various kinds of semiconductor storage devices including volatile memories and nonvolatile memories. For example, the present embodiment is also applicable to a resistance change memory of the same kind as the MRAM, such as a resistive random access memory (ReRAM) or a phase-change random access memory (PCRAM).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
   a memory cell array comprising memory cells including magnetic tunnel junction (MTJ) elements;
   a write and read circuit which performs a write operation and a read operation for the memory cells;
   a temperature sensor which outputs temperature information corresponding to a temperature of the memory cell array; and
   a memory controller which controls the write operation and the read operation by the write and read circuit in accordance with the temperature information,
   wherein the temperature sensor outputs first information when the temperature of the memory cell array is a first temperature, and the temperature sensor outputs second information when the temperature of the memory cell array is a second temperature,
   wherein when the first information is received, the memory controller controls the read operation to include an error checking and correcting (ECC) operation to detect an error in read data read from the memory cells and correct the error, and
   wherein when the second information is received, the memory controller controls the read operation to not include the ECC operation.

2. The resistance change memory according to claim 1, wherein:
   the memory controller sets a write duration time to write into the memory cells to a first duration time when receiving the first information, and the memory controller sets the write duration time to a second duration time that is longer than the first duration time when receiving the second information.

3. The resistance change memory according to claim 2, wherein the write duration time is a time to pass a write current through the MTJ element.

4. The resistance change memory according to claim 1, wherein:
   the memory controller sets a read duration time to read from the memory cells to a first duration time when receiving the first information, and the memory controller sets the read duration time to a second duration time that is shorter than the first duration time when receiving the second information.

5. The resistance change memory according to claim 2, wherein:
   the temperature sensor outputs third information when the temperature of the memory cell array is a third temperature that is lower than the first temperature and that is higher than the second temperature, and
   the memory controller sets the write duration time to a third duration time that is longer than the first duration time and that is shorter than the second duration time when receiving the third information.

6. The resistance change memory according to claim 4, wherein:
   the temperature sensor outputs third information when the temperature of the memory cell array is a third temperature that is lower than the first temperature and that is higher than the second temperature, and
   the memory controller sets the read duration time to a third duration time that is longer than the first duration time and that is shorter than the second duration time when receiving the third information.

7. The resistance change memory according to claim 1, wherein the resistance change memory comprises a magnetoresistive random access memory (MRAM).

8. A resistance change memory comprising:
   a memory cell array comprising memory cells including magnetic tunnel junction (MTJ) elements;
   a write and read circuit which performs a write operation and a read operation for the memory cells;
   a temperature sensor which outputs temperature information corresponding to a temperature of the memory cell array; and
   a memory controller which controls the write operation and the read operation by the write and read circuit in accordance with the temperature information,
   wherein the temperature sensor outputs first information when the temperature of the memory cell array is a first temperature, and the temperature sensor outputs second information when the temperature of the memory cell array is a second temperature that is lower than the first temperature,
   wherein when receiving the first information, the memory controller sets a write duration time to write into the memory cells to a first duration time, and the memory controller sets a read duration time to read from the memory cells to a second duration time,
   wherein when receiving the second information, the memory controller sets the write duration time to a third duration time that is longer than the first duration time, and the memory controller sets the read duration time to a fourth duration time that is shorter than the second duration time,
   wherein when the first information is received, the memory controller controls the read operation to include an error checking and correcting (ECC) operation to detect an error in read data read from the memory cells and correct the error, and wherein when the second information is received, the memory controller controls the read operation to not include the ECC operation.

9. The resistance change memory according to claim 8, wherein the write duration time is a time to pass a write current through the MTJ element.

10. The resistance change memory according to claim 8, wherein:

the temperature sensor outputs third information when the temperature of the memory cell array is a third temperature that is lower than the first temperature and that is higher than the second temperature, and the memory controller sets the write duration time to a fifth duration time that is longer than the first duration time and that is shorter than the second duration time when receiving the third information.

11. The resistance change memory according to claim 8, wherein:

the temperature sensor outputs third information when the temperature of the memory cell array is a third temperature that is lower than the first temperature and that is higher than the second temperature, and the memory controller sets the read duration time to a fifth duration time that is shorter than the second duration time when receiving the third information.

12. The resistance change memory according to claim 8, wherein the resistance change memory comprises a magnetoresistive random access memory (MRAM).

13. A resistance change memory comprising:

a memory cell array comprising memory cells including resistance change elements;

a write and read circuit which performs a write operation and a read operation for the memory cells;

a temperature sensor which outputs temperature information corresponding to a temperature of the memory cell array; and a memory controller which controls the write operation and the read operation by the write and read circuit in accordance with the temperature information, wherein the temperature sensor outputs first information when the temperature of the memory cell array is a first temperature, and the temperature sensor outputs second information when the temperature of the memory cell array is a second temperature that is lower than the first temperature, wherein when the first information is received, the memory controller controls the read operation to include an error checking and correcting (ECC) operation to detect an error in read data read from the memory cells and correct the error, and wherein when the second information is received, the memory controller controls the read operation to not include the ECC operation.

14. The resistance change memory according to claim 13, wherein:

the memory controller sets a write duration time to write into the memory cells to a first duration time when receiving the first information, and the memory controller sets the write duration time to a second duration time that is longer than the first duration time when receiving the second information.

15. The resistance change memory according to claim 14, wherein the write duration time is a time to pass a write current through the resistance change element.

16. The resistance change memory according to claim 13, wherein:

the memory controller sets a read duration time to read from the memory cells to a first duration time when receiving the first information, and the memory controller sets the read duration time to a second duration time that is shorter than the first duration time when receiving the second information.

17. The resistance change memory according to claim 13, wherein the resistance change memory comprises a magnetoresistive random access memory (MRAM).

* * * * *